(12) United States Patent
Han

(10) Patent No.: US 6,475,914 B2
(45) Date of Patent: Nov. 5, 2002

(54) METHOD OF MANUFACTURING SEMICONDUCTOR DEVICE FOR PROTECTING CU LAYER FROM POST CHEMICAL MECHANICAL POLISHING-CORROSION

(75) Inventor: Ja-Hyung Han, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/899,225

(22) Filed: Jul. 6, 2001

(65) Prior Publication Data
US 2002/0034876 A1 Mar. 21, 2002

(30) Foreign Application Priority Data
Jul. 22, 2000 (KR) .............................. 00-42155

(51) Int. Cl.⁷ ................................. H01L 21/44
(52) U.S. Cl. .................. 438/687; 438/633; 438/691; 438/692; 438/906
(58) Field of Search ................. 438/687, 631, 438/633, 691–693, 906

(56) References Cited

U.S. PATENT DOCUMENTS

| | | | | |
|---|---|---|---|---|
| 5,893,756 A | * | 4/1999 | Berman et al. ............. 134/2 |
| 5,897,375 A | | 4/1999 | Watts et al. | |
| 6,068,879 A | * | 5/2000 | Pasch ...................... 427/307 |
| 6,114,234 A | * | 9/2000 | Merchant et al. ........... 438/631 |
| 6,117,775 A | * | 9/2000 | Kondo et al. .............. 438/690 |
| 6,123,088 A | * | 9/2000 | Ho ........................ 134/1.3 |
| 6,150,269 A | * | 11/2000 | Roy ....................... 257/762 |
| 6,194,366 B1 | * | 2/2001 | Naghshineh et al. ........ 510/175 |
| 6,225,223 B1 | * | 5/2001 | Liu et al. ................ 438/637 |
| 6,251,787 B1 | * | 6/2001 | Edelstein et al. .......... 205/645 |
| 6,328,042 B1 | * | 12/2001 | Gotkis .................... 134/1.3 |

FOREIGN PATENT DOCUMENTS

JP 8-64594 3/1996

* cited by examiner

Primary Examiner—Tuan H. Nguyen
Assistant Examiner—Thanh Nguyen
(74) Attorney, Agent, or Firm—Lee & Sterba, P.C.

(57) ABSTRACT

A method of manufacturing a semiconductor device for protecting a Cu layer from post chemical mechanical polishing (CMP) corrosion and CMP equipment therefore wherein, when wafers on which a Cu layer is formed wait to be transferred to a cleaning system after being polished in a CMP equipment, the wafers collected at a stand-by station are supplied with a solution containing a corrosion inhibitor, thus at least keeping the polished surface of Cu layer wet with the solution. Then, the wafers collected at the stand-by station are transferred to the cleaning system and cleaned. In the present invention, the solution uses a solution in which the corrosion inhibitor is added to de-ionized water. Furthermore, while transferring the wafers, the surfaces of the transferred wafers are kept wet with a solution containing a corrosion inhibitor.

18 Claims, 5 Drawing Sheets

METHOD OF MANUFACTURING SEMICONDUCTOR DEVICE FOR PROTECTING CU LAYER FROM POST CHEMICAL MECHANICAL POLISHING-CORROSION

BACKGROUND OF THE INVENTION

1. Field of the Invention

The present invention relates to a semiconductor device manufacture. More particularly, the present invention relates to a method of manufacturing a semiconductor device for inhibiting the corrosion of a copper (Cu) layer after chemical mechanical polishing (CMP) and chemical mechanical polishing equipment used in the same.

2. Description of the Related Art

As high integration and high performance of semiconductor devices continue to make progress, the use of a Cu layer as a wiring material in a semiconductor device has been proposed. A Cu layer is patterned by a damascene technique to obtain wiring lines. The patterning of a Cu layer involves the use of CMP process after forming the Cu layer.

A Cu layer, however, is susceptible to corrosion during its formation. A Cu layer can be corroded during a CMP process or during a cleaning process after the CMP process. It is well known that the corrosion of a Cu layer results from galvanic corrosion and photo assisted corrosion. One approach to inhibiting the corrosion of a Cu layer during CMP includes continuously forming a corrosion barrier layer on the surface of a metal layer during CMP.

However, the corrosion of a Cu layer may occur during a post CMP process. More specifically, wafers to be loaded into CMP equipment for CMP of a Cu layer are held in a carrier, and several wafers are loaded into the CMP equipment at one time. Thus, wafers on which CMP is performed are among wafers loaded into the CMP equipment that must stand-by at an unloading station of the CMP equipment until the remaining wafers are subjected to CMP. For example, if twenty-five wafers corresponding to one run are loaded into the CMP equipment, wafers initially subjected to CMP may wait for about more than two hours at the unloading station.

The surfaces of the wafers being on stand-by are wet from a solution used in CMP, and a material that induces corrosion such as a slurry or an oxidizer may remain in the solution. The solution, wetting the polished surface of a Cu layer, may lead to galvanic corrosion or photo assisted corrosion. If two or more hours are required as a stand-by time as described above, the significant corrosion may occur. Furthermore, since the polished wafers collect at the stand-by station and are then transferred to a cleaning step, the corrosion may continuously occur during a transfer time along with the stand-by time.

SUMMARY OF THE INVENTION

To solve the above problems, it is a feature of an embodiment of the present invention to provide a method of manufacturing a semiconductor device which can prevent the polished surface of a Cu layer from being corroded after chemical mechanical polishing (CMP).

It is another feature of an embodiment of the present invention to provide CMP equipment for protecting the polished surface of a Cu layer from corrosion after CMP.

Accordingly, to provide the above features, the present invention provides a method of manufacturing a semiconductor device for preventing the corrosion of a Cu layer.

When a wafer, on which a Cu layer is formed, stands by so as to be transferred to a cleaning system after being subjected to CMP in a CMP equipment, a solution containing a corrosion inhibitor is provided to the wafers collected at a stand-by station, so as to keep at least the polished surface of the Cu layer wet with the solution. Then, the wafers collected at the stand-by station are transferred to the cleaning system and cleaned. In this case, the solution is a solution in which the corrosion inhibitor is added to de-ionized water. Benzo-tri-azole is preferably used as the corrosion inhibitor. While transferring the wafer to the cleaning system, the surfaces of the transferred wafers are kept wet with the solution containing the corrosion inhibitor.

An embodiment of the present invention also provides CMP equipment including a polishing station including a polishing pad on which wafers from a carrier are sequentially loaded and a Cu layer formed on each wafer is polished, and a stand-by station where a vacant carrier, into which wafers unloaded by a robot at the polishing station are sequentially inserted, stands by and for supplying a solution containing a corrosion inhibitor onto the polished surface of the Cu layer on the inserted wafers.

In this case, the stand-by station includes a solution vessel for containing the solution so that the carrier may be loaded and soaked in the supplied solution, a supply pipe for supplying the solution to the solution vessel, a discharge pipe for drawing the solution from the solution vessel, and a solution supply container, connected to the supply pipe, for supplying the solution.

The present invention makes it possible to protect the polished Cu layer on a wafer from post CMP corrosion.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE PREFERRED EMBODIMENTS

Figure 1:
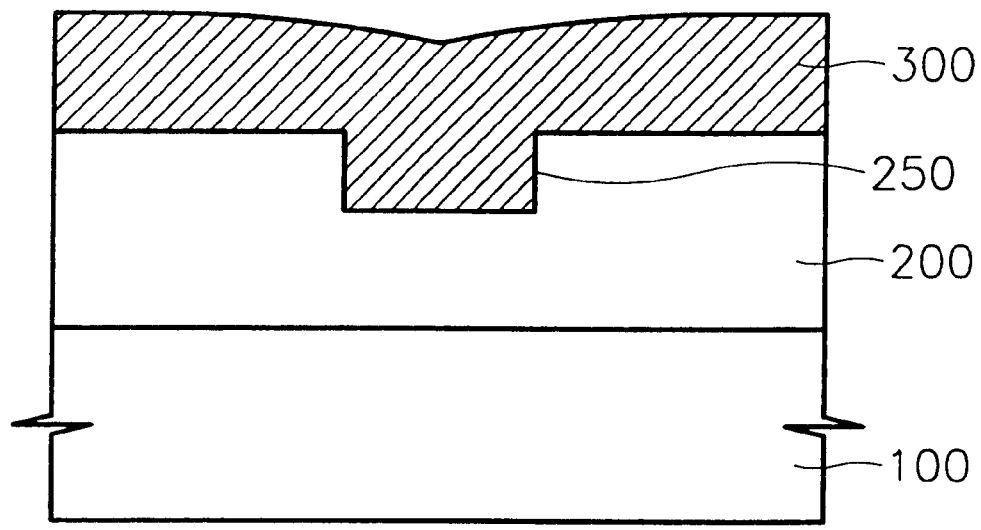
FIGS. 1 and 5 illustrate cross-sectional views of a method of manufacturing a semiconductor device according to an embodiment of the present invention.

Korean Patent Application No. 00-42155, filed on Jul. 22, 2000, and entitled: "Method of Manufacturing Semiconductor Device for Protecting Cu Layer from Post Chemical Mechanical Polishing-Corrosion and Chemical Mechanical Polishing Equipment Used in the Same,"is incorporated by reference herein in its entirety.

The present invention will now be described more fully with reference to the accompanying drawings, in which preferred embodiments of the invention are shown. The present invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the shape of elements is exaggerated for clarity, and the same reference numerals in different drawings represent the same element. Further, it will be understood that when a layer is referred to as being "on"another layer or substrate, it can be directly on the other layer or substrate, or intervening layers may also be present.

FIG. 1 schematically illustrates forming a Cu layer 300 on a wafer 100. More specifically, an interlayer dielectric layer 200 is formed of an insulating material such as silicon oxide on the wafer 100. Then, a metal layer to be used as a wiring layer, such as the Cu layer 300, is formed on the interlayer dielectric layer 200 using electro-plating. In this case, the Cu layer may be formed by electro-plating after forming a seed layer (not shown) on the interlayer dielectric layer 200.

Various techniques may be used in patterning the Cu layer 300 in order to use the Cu layer 300 as a wiring line of a semiconductor device. This embodiment involves patterning of the Cu layer 300 as a wiring line by a damascene technique. Therefore, forming a trench 250 for a damascene process is followed by a process of forming the Cu layer 300, during which the Cu layer 300 is formed to a thickness greater than the depth of the trench so as to completely fill the trench 250.

Figure 2:
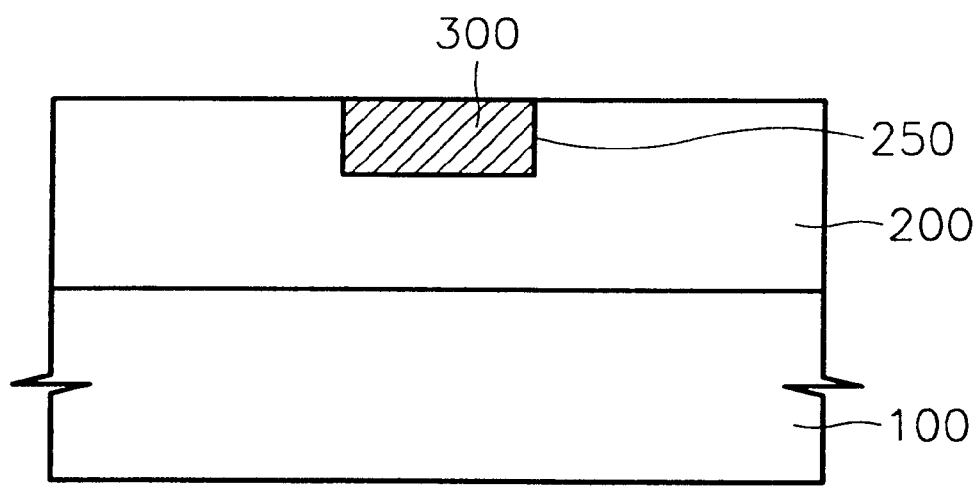

FIG. 2 schematically illustrates the step of patterning the Cu layer 300 as a wiring line by subjecting it to chemical mechanical polishing (CMP). More specifically, a plurality of wafers 100, on each of which the Cu layer 300 is formed, are inserted into a carrier. In this case, the wafers 100 corresponding to one run, for example, about twenty-five wafers are inserted into each carrier. A carrier 411, into which the wafers 100 are inserted, is loaded into the CMP equipment shown in FIG. 7. The carrier 411 is sent to a loading-unloading station 421 and 425 by a linear wafer robot 413.

The loading-unloading station 421 and 425 is used as a stand-by station at which the wafers 100 stand-by when supplying/collecting the wafers 100 to/from a polishing station 450 of the CMP equipment one-by-one. Thus, the loading-unloading station 421 and 425 is composed of a loading station 421 and an unloading station 425 at which the carrier 411 holding the wafers 100 stands by. The loading station 421 is used as a loading stand-by station at which the wafers 100 wait to be transferred to the polishing station 450, while the unloading station 425 is used as an unloading stand-by station at which the wafers collected from the polishing station 450 wait to be unloaded to the outside of the CMP equipment. Thus, initially, the wafers 100 to be loaded into the CMP equipment stand-by at the loading station 421 while being held in the carrier 411.

A polar wafer robot 431, installed on a transfer station 430 near the loading-unloading station 421 and 425, sequentially transfers the wafers 100, which are held in the carrier 411 and are standing by at the loading station 421, to a wafer loading-unloading module 440. The transferred wafers 100 are sequentially loaded onto a plurality of polishing pads 456. In this case, an in-line metrology 433 provided at the transfer station 430 senses whether the transfer of the wafers 100 is appropriate or not.

A pad conditioner 453 is provided over the polishing pad 456, and the wafer 100 is subjected to CMP when the surface thereof to be polished is in contact with the polishing pad 456 by a turret 445. In this case, CMP is performed so that the surface of the interlayer dielectric layer 200 underlying the Cu layer 300 may be exposed, as shown in FIG. 2. The Cu layer 300 remains selectively within the trench 250, so as to be patterned as a wiring line. As known in the art, a polishing solution which contains a slurry or oxidizer is used in CMP. When performing CMP, a corrosion inhibitor may be included in the polishing solution so as to prevent the surface of the Cu layer from being corroded.

Figure 3:
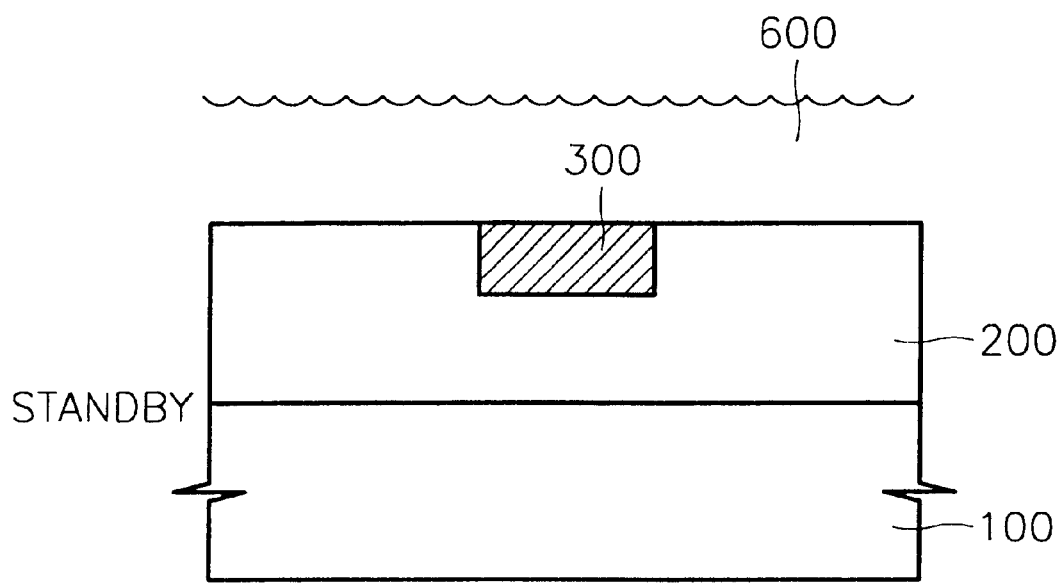
Figure 7:
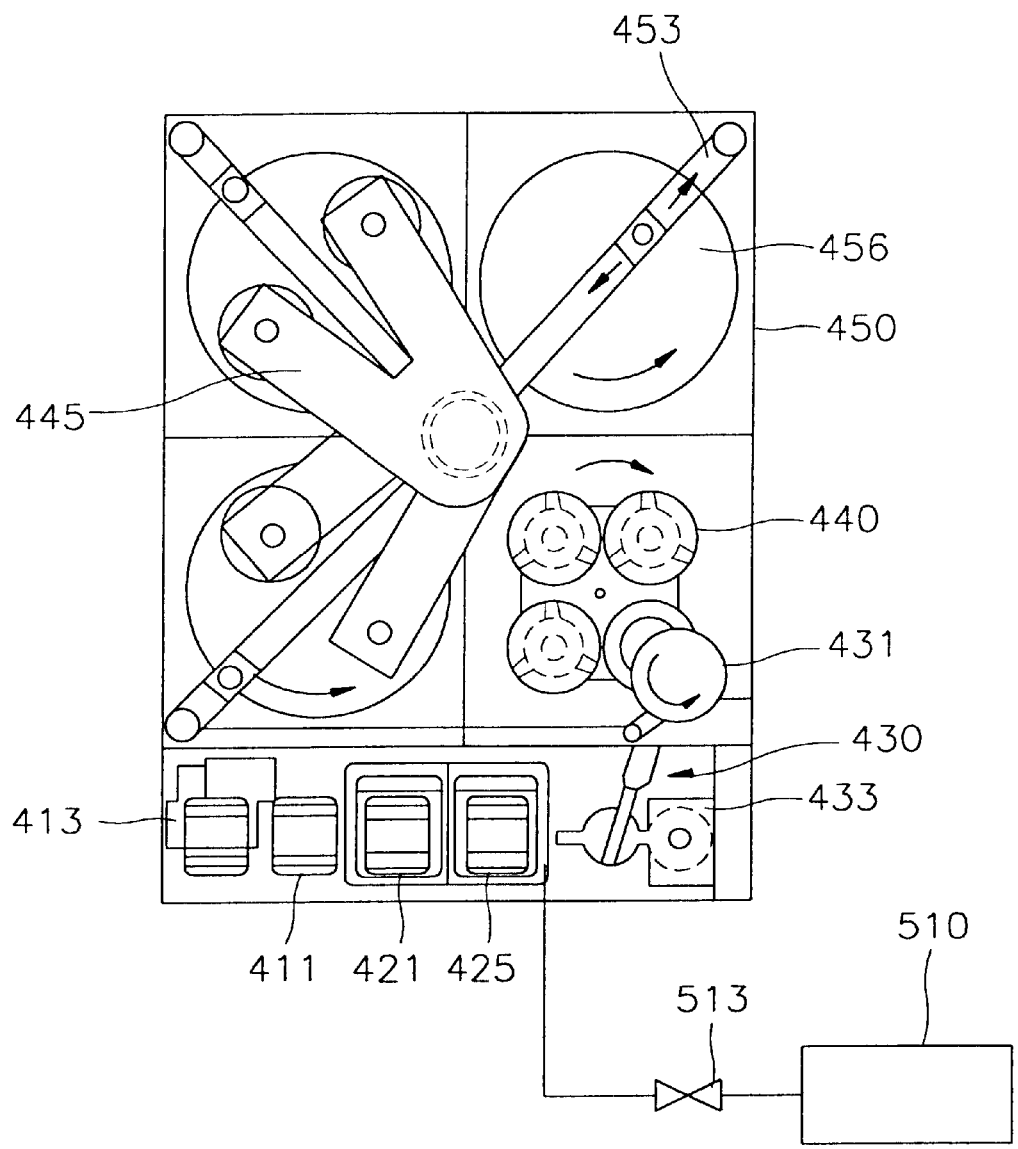
FIGS. 7 and 8 schematically illustrate chemical mechanical polishing equipment used in the method of manufacturing a semiconductor device according to an embodiment of the present invention.

FIG. 3 schematically shows the wafers 100 in stand-by while supplying a solution 600 containing a corrosion inhibitor to the polished surface of the wafer 100, containing patterned Cu layer 300. Specifically, the wafers 100 for which polishing is complete are sequentially inserted into the vacant carrier 411 being on stand-by so that the loading-unloading station 421 and 425, actually a stand-by station, which is the unloading station 425, may be filled with the wafers 100 from the wafer loading-unloading module 440 of the CMP equipment as shown in FIG. 7. In this case, the polishing solution containing a slurry may remain on the surface of the Cu layer 300 until polishing of the wafer 100 inserted into the vacant carrier 411 waiting at the stand-by station, i.e., the unloading station 425, is complete. Furthermore, the wafer 100, which is inserted into the carrier 411 waiting at the unloading station 425, must stand-by with the polishing solution, in particular, a slurry, remaining on the surface thereof, until the carrier 411 is completely filled with the wafers 100 at which time the polishing is performed.

Accordingly, it takes considerable time for the waiting carrier 411 to be completely filled with the polished wafers 100. Since the CMP equipment shown in FIG. 7 performs single wafer type polishing, if one run is twenty-five wafers as above, the polished wafer 100 initially inserted into the carrier 411 needs to stand-by at the carrier 411, i.e., the unloading station 425, until all twenty-five wafers are subjected to polishing. It is estimated that about two hours are required for polishing twenty-five wafers using CMP equipment.

If the polished wafer 100 stands-by for a long time with the polishing solution, in particular, a slurry or oxidizer, remaining on the surface, the presence of the remaining polishing solution such as the slurry or oxidizer may cause galvanic corrosion or photo assisted corrosion on the polished surface of the Cu layer 300. Thus, the surface of the polished Cu layer 300 is corroded, which results in failures in the wiring.

Figure 6:
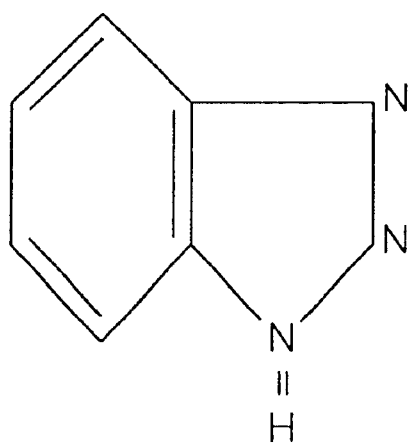
FIG. 6 schematically illustrates a corrosion inhibitor used in the method of manufacturing a semiconductor device according to an embodiment of the present invention.

In order to prevent corrosion on the surface of the polished Cu layer 300 during stand-by time before the polished wafer 100 is transferred to a cleaning step after CMP, an embodiment of the invention involves providing a solution containing a corrosion inhibitor on the surface of the standing wafer 100. A corrosion inhibitor, benzo-triazole (BTA; $C_6H_5N_3$), as shown in FIG. 6, may be preferably used. In addition, the corrosion inhibitor may include a material such as indiazole, benzimidazole, mercaptobenzothiazole, or imidazoline thione.

The corrosion inhibitor, such as BTA, is dissolved in de-ionized water and used as a solution 600, in which case the corrosion inhibitor is added to the de-ionized water below a saturation concentration. If the solution 600 comprised of the de-ionized water, to which the corrosion inhibitor is added, is provided onto the polished surface of the wafer 100, the corrosion inhibitor added to the solution 600, for example, BTA, reacts with the surface of the Cu layer 300 to form a polymeric complex layer on the surface of the Cu layer 300 to a thickness of 10–20 molecules. The polymeric complex layer may serve as a mechanical and electrochemical barrier layer for suppressing corrosion. Specifically, the polymeric complex layer may serve as a protective layer which prevents occurrence of galvanic corrosion or photo assisted corrosion when the oxidizer or slurry included in the polishing solution, which remains on the surface of the polished wafer 100, reacts with the surface of the Cu layer 300. Thus, even if the wafer 100 waits at a stand-by station, i.e., the unloading station, for a long time, corrosion on the surface of the Cu layer 300 can be prevented by providing the solution 600 comprised of corrosion inhibitor-added de-ionized water to the polished wafer surface.

Figure 8:
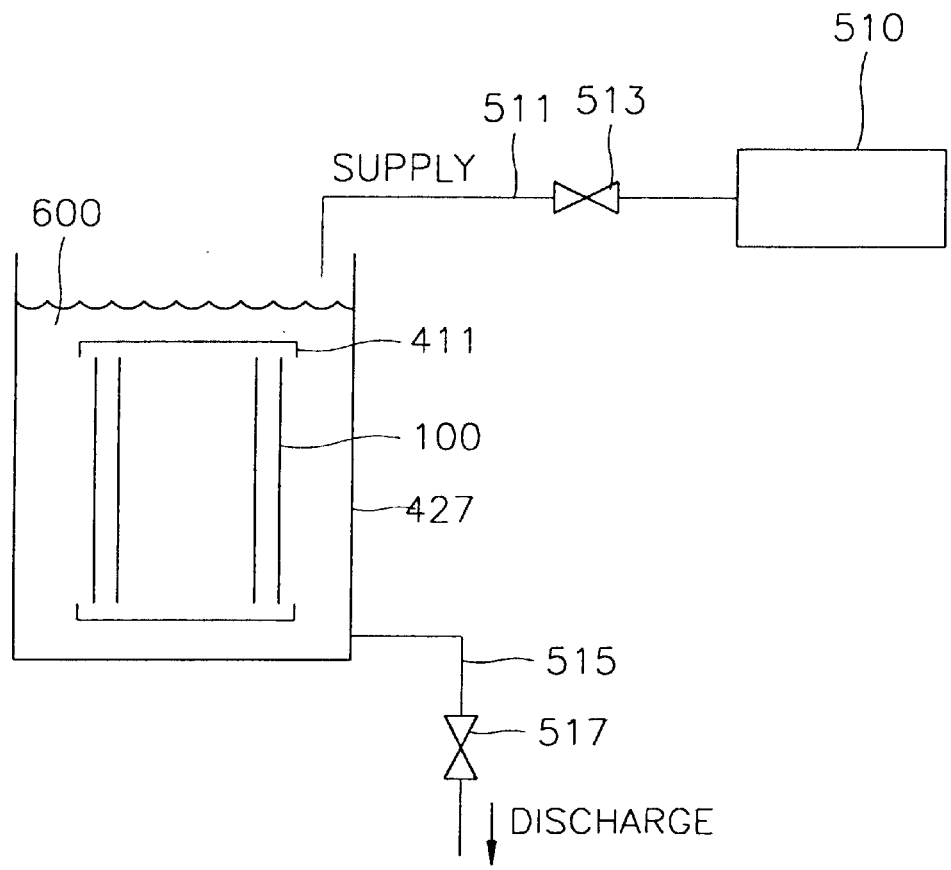

In order to supply the solution 600 composed of corrosion inhibitor-added deionized water to the wafer 100 standing-by held in the carrier 411 as described above, the stand-by station, i.e., the unloading station 425, can be configured as shown in FIG. 8.

Referring to FIG. 8, the stand-by station, i.e., the unloading station 425 includes a solution vessel 427 for housing the carrier 411, into which the wafers 100 to be polished are inserted and loaded. One end of a supply pipe 511 for supplying the solution 600 on the wafer 100 of the carrier 411 is connected to the solution vessel 427 while the other end is connected to a solution supply container 510, so that the solution 600 contained in the solution supply container 510 is smoothly supplied to the solution vessel 427 and further onto the surface of the wafer 100. In this case, a supply valve 513 may be used to control the supply of the solution 600 from the solution supply container 510. The lower end of the solution vessel 427 is connected to a discharge pipe 515 so that the used solution 600 can be drawn, and a discharge valve 517 may be used to control the drawing of the solution.

The solution is provided to the solution vessel of the stand-by station, i.e., the unloading station 425, enough to wet the surface of the wafer 100 inserted into the carrier 411. Preferably, the amount of the solution 600 to be supplied is controlled by the supply valve 513 so that the polished wafers 100 standing by within the solution vessel 427 may be sufficiently soaked in the solution 600 within the solution vessel 427. By doing so, the surface of the wafer 100, in particular, the surface of the polished Cu layer 300, is wet with the solution 600.

Figure 4:
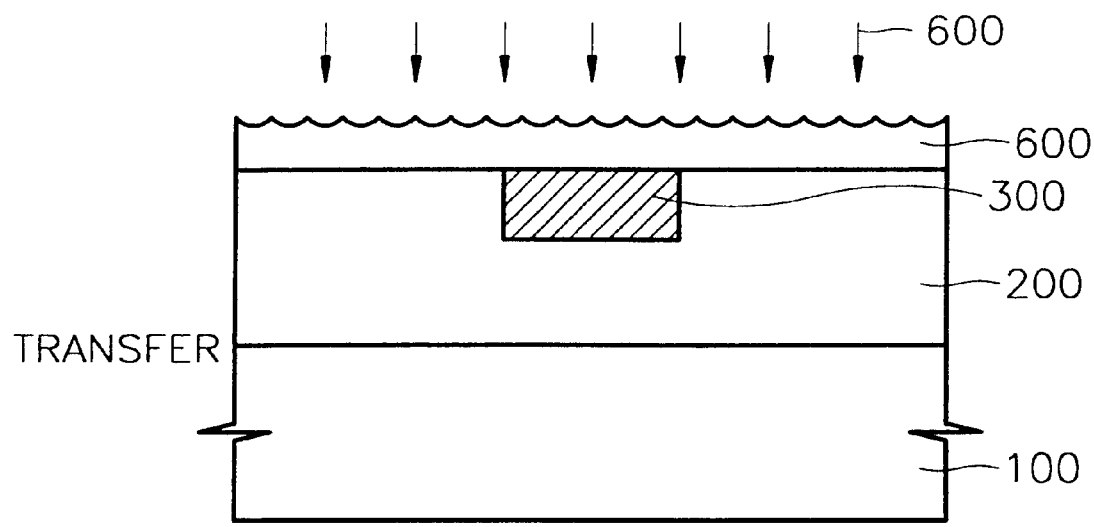

FIG. 4 schematically illustrates transferring the polished wafer 100 to a cleaning system. Specifically, if the wafers 100 collected from the polishing station 450 are all inserted into the carrier 411 and loaded into the stand-by station of the CMP equipment, i.e., the unloading station 425, then the carrier 411 is transferred to a cleaning system installed separately from the CMP equipment. It is preferable that the surface of the wafers 100, actually the surface of the Cu layer 300 is also kept wet with the solution containing the corrosion inhibitor during such a transfer. In order to maintain the surface of the Cu layer 300 in a wet state during the transfer, when necessary, the solution 600 containing the corrosion inhibitor may be additionally supplied to the carrier 411, actually the wafer 100, while transferring the carrier 411.

Figure 5:
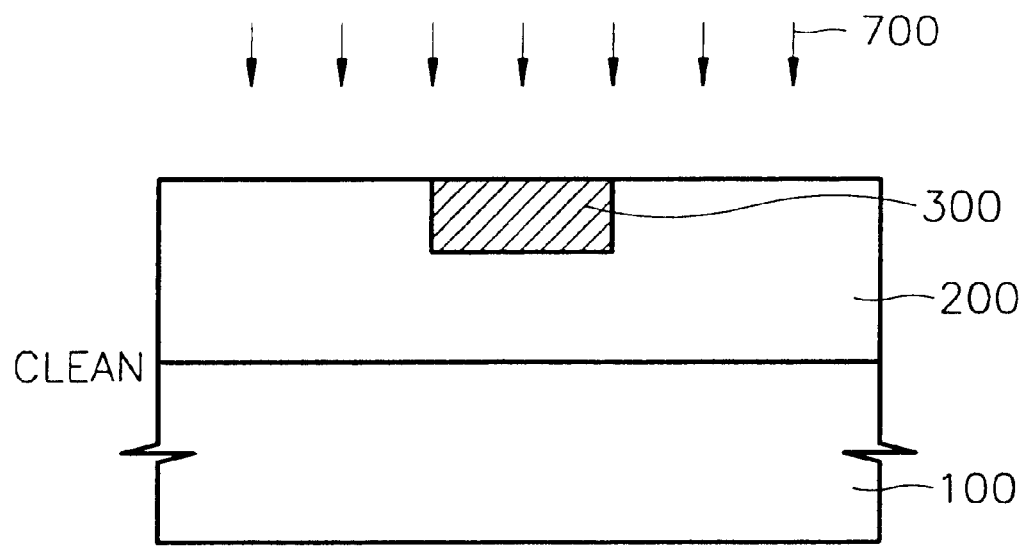

FIG. 5 schematically shows the step of cleaning the polished wafer 100 with cleaning solution 700. Specifically, a cleaning solution 700, for example, de-ionized water is provided onto the wafers 100 transferred to the cleaning system thereby removing a material remaining on the surface of the wafers 100. In this case, the corrosion inhibitor such as BTA may be added to the cleaning solution 700. The addition of the corrosion inhibitor can further prevent galvanic corrosion or photo assisted corrosion of the Cu layer 300 which may occur during a cleaning step.

While this invention has been particularly shown and described with reference to preferred embodiments thereof, it will be understood by those of ordinary skill in the art that various changes in form and details may be made therein without departing from the spirit and scope of the invention as defined by the appended claims.

What is claimed is:

1. A method of manufacturing a semiconductor device for preventing the corrosion of a copper (Cu) layer, the method comprising:

performing chemical mechanical polishing (CMP) on a Cu layer formed on a wafer;

providing a solution containing a corrosion inhibitor onto the surface of the Cu layer subjected to CMP;

placing the wafer with the polished surface of the Cu layer wet with the solution at a stand-by station that is integral to an apparatus for performing the CMP;

transferring the wafer to a cleaning system that is installed separately from the apparatus for performing the CMP; and cleaning the wafer.

2. The method of claim 1, wherein the solution is a solution in which the corrosion inhibitor is added to de-ionized water.

3. The method of claim 2, wherein the corrosion inhibitor is selected from the group consisting of benzo-tri-azole, indiazole, benzimidazole, mercaptobenzothiazole, or imidazoline thione.

4. The method of claim 1, wherein transferring the wafer to the cleaning system is performed with the polished surface of the Cu layer wet with the solution.

5. The method of claim 4, wherein transferring the wafer to the cleaning system comprises additionally supplying a solution containing a corrosion inhibitor onto the wafer.

6. The method of claim 5, wherein the corrosion inhibitor is selected from the group consisting of benzo-tri-azole, indiazole, benzimidazole, mercaptobenzothiazole, or imidazoline thione.

7. The method of claim 1, wherein cleaning the wafer comprises supplying de-ionized water to which a corrosion inhibitor is added onto the surface of the wafer.

8. The method of claim 7, wherein the corrosion inhibitor is benzo-tri-azole, indiazole, benzimidazole, mercaptobenzothiazole, or imidazoline thione.

9. A method of manufacturing a semiconductor device for preventing corrosion of a copper (Cu) layer, the method comprising:

sequentially loading a plurality of wafers, on each of which a Cu layer is formed, into a polishing pad of a chemical mechanical polishing (CMP) equipment, and polishing the Cu layer;

sequentially unloading the wafers, on which the surface of the Cu layer is polished, from the polishing pad to a stand-by station that is integral to an apparatus for performing the CMP;

supplying a solution containing a corrosion inhibitor to the wafers sequentially unloaded and placing the unloaded wafers with the polished surface of the Cu layer wet with the solution;

transferring the wafers collected at the stand-by station to a cleaning system that is installed separately from the apparatus for performing the CMP; and cleaning the wafers.

10. The method of claim 9, wherein the wafers held in a carrier are loaded into the CMP equipment, wherein the unloaded wafers are sequentially inserted into a vacant carrier prepared at the stand-by station of the CMP equipment, and the carrier filled with the unloaded wafers is transferred to the cleaning system, and wherein the carrier into which the unloaded wafers are inserted stands by at the stand-by station while being soaked in the solution.

11. The method of claim 10, wherein the solution is continuously supplied to the carrier into which the unloaded wafers are inserted while the carrier waits at the stand-by station.

12. The method of claim 9, wherein the solution is a solution in which the corrosion inhibitor is added to de-ionized water.

13. The method of claim 9, wherein the corrosion inhibitor is selected from the group consisting of benzo-tri-azole, indiazole, benzimidazole, mercaptobenzothiazole, or imidazoline thione.

14. The method of claim 9, wherein transferring the wafer to the cleaning system is performed with the polished surface of the Cu layer wet with the solution.

15. The method of claim 14, wherein transferring the wafer to the cleaning system comprises additionally supplying a solution containing a corrosion inhibitor to the wafer.

16. The method of claim 15, wherein the corrosion inhibitor is one among the group consisting of benzo-tri-azole, indiazole, benzimidazole, mercaptobenzothiazole, and imidazoline thione.

17. The method of claim 9, wherein cleaning the wafer comprises supplying de-ionized water containing a corrosion inhibitor onto the surface of the wafer.

18. The method of claim 17, wherein the corrosion inhibitor is selected from the group consisting of benzo-tri-azole, indiazole, benzimidazole, mercaptobenzothiazole, or imidazoline thione.

* * * * *